(12) United States Patent
Bohnert et al.

(10) Patent No.: US 8,233,754 B2
(45) Date of Patent: Jul. 31, 2012

(54) OPTICAL HIGH VOLTAGE SENSOR

(75) Inventors: Klaus Bohnert, Oberrohrdorf (CH); Andreas Frank, Zürich (CH); Hubert Brändle, Oberengstringen (CH)

(73) Assignee: ABB Research Ltd., Zurich (CH)

( * ) Notice: Subject to any disclaimer, the term of this patent is extended or adjusted under 35 U.S.C. 154(b) by 278 days.

(21) Appl. No.: 12/488,779

(22) Filed: Jun. 22, 2009

(65) Prior Publication Data

US 2009/0290165 A1  Nov. 26, 2009

Related U.S. Application Data

(63) Continuation of application No. PCT/CH2006/000735, filed on Dec. 22, 2006.

(51) Int. Cl.
  *G02B 6/00* (2006.01)
  *G02B 6/02* (2006.01)
(52) U.S. Cl. .......................... 385/12; 385/123
(58) Field of Classification Search .......... 385/12, 385/123
  See application file for complete search history.

(56) References Cited

U.S. PATENT DOCUMENTS

| | | | |
|---|---|---|---|
| 4,269,483 A | 5/1981 | Feldtkeller | |
| 4,904,931 A | 2/1990 | Miller | |
| 5,642,454 A * | 6/1997 | Kopylov et al. | 385/123 |
| 5,651,083 A * | 7/1997 | Kortan et al. | 385/123 |
| 5,703,986 A * | 12/1997 | Brehm et al. | 385/123 |
| 5,904,983 A * | 5/1999 | Chan et al. | 428/392 |
| 5,946,439 A * | 8/1999 | Terasawa et al. | 385/126 |
| 6,876,188 B2 * | 4/2005 | Bohnert et al. | 324/96 |
| 6,885,182 B2 * | 4/2005 | Bohnert et al. | 324/96 |
| 7,373,056 B2 * | 5/2008 | Bohnert et al. | 385/101 |
| 2002/0006244 A1 | 1/2002 | Bohnert | |
| 2004/0160608 A1 | 8/2004 | Bohnert et al. | |
| 2005/0088662 A1 | 4/2005 | Bohnert et al. | |
| 2009/0289617 A1 * | 11/2009 | Bohnert | 324/96 |

FOREIGN PATENT DOCUMENTS

| | | |
|---|---|---|
| EP | 0 682 261 A2 | 11/1995 |
| EP | 1 154 278 B1 | 11/2001 |
| EP | 1 512 981 B1 | 3/2005 |

OTHER PUBLICATIONS

PCT/ISA/210 dated Aug. 16, 2007.
PCT/ISA/237 dated Aug. 16, 2007.
PCT/IPEA/409 dated Apr. 3, 2009.
Shim et al., "Luminescence, radiation damage, and color center creation in $Eu^{3+}$-doped $Bi_4Ge_3O_{12}$ fiber single crystals", Journal of Applied Physics, vol. 93, No. 9, May 1, 2003, pp. 5131-5135.
Wang et al., "Hybrid high refraction index polymer coatings", Proceedings of SPIE, vol. 5724, 42, 2005, pp. 1-8.

(Continued)

*Primary Examiner* — Rhonda Peace
(74) *Attorney, Agent, or Firm* — Buchanan Ingersoll & Rooney PC

(57) ABSTRACT

An electro-optical high-voltage sensor includes a waveguiding sensing fiber of an electro-optical material. The electrical field of the voltage to be measured is substantially parallel to the longitudinal axis of the sensing fiber. The sensing fiber carries two orthogonally polarized light waves, with the applied field affecting the birefringence between the waves. Using an electro-optical waveguiding fiber in this configuration allows the voltage between two widely spaced points to be accurately measured.

61 Claims, 3 Drawing Sheets

OTHER PUBLICATIONS

Chavez et al., "Accurate Voltage Measurement With Electric Field Sampling Using Permittivity-Shielding", IEEE Transactions on Power Delivery, vol. 17, No. 2, Apr. 2002, pp. 362-368.

Yoon et al., "Crystal growth of dislocation-free $LiNbO_3$ single crystals by micro pulling down method", Journal of Crystal Growth 142, 1994, pp. 339-343.

Williams et al., "Optical, thereto-optic, electro-optic, and photoelastic properties of bismuth germanate ($Bi_4Ge_3O_{12}$)", Applied Optics, vol. 35, No. 19, Jul. 1, 1996, pp. 3562-3569.

Wang et al., "Hybrid high refractive index polymer coatings", in Proceedings of SPIE, vol. 5724, 42, 2005, pp. 1-8.

Flaim et al., "High Refractive Index Polymer Coatings for Optoelectronics Applications", SPIE Proceedings on Optical Systems Design, Advances in Optical Thin Films, vol. 5250, 423, 2003, pp. 1-12.

Lü et al., "Preparation and characterization of ZnS-polymer nanocomposite films with high refactive index", J. Matr. Chem., 13, 2003, pp. 2189-2195.

Raymond et al., "Thermoluminescence Spectra of Doped $Bi_4Ge_3O_{12}$", Radiation Measurements, vol. 23, No. 1, 1994, pp. 195-202.

Mahdavi et al., "Formation of planar waveguides in bismuth germanate by $^4He^+$ ion implantation", Journal of Applied Physics, 22, 1989, pp. 1354-1357.

Mahdavi et al., "Optical properties of bismuth germanate [BGO(2:3)] waveguides formed by ion implantation", Nuclear Instrument and Methods in Physics Research B65, 1992, pp. 251-255.

Miura et al., "Photowritten optical waveguides in various glasses with ultrashort pulse laser", Appl. Phys. Lett, 71 (23), Dec. 8, 1997, pp. 3329-3331.

McCullough et al., "Persistent refractive index gratings in bismuth germanium oxide doped with chromium", Journal of Applied Physics, vol. 90, No. 12, Dec. 15, 2001, pp. 6022-6025.

Lefevre, "The Fiber-Optic Gyroscope", Artech House, Boston, London, 1993, pp. 1-33.

* cited by examiner

OPTICAL HIGH VOLTAGE SENSOR

RELATED APPLICATION

This application claims priority as a continuation application under 35 U.S.C. §120 to PCT/CH2006/00735 filed as an International Application on Dec. 22, 2006 and designating the U.S., the entire content of which is hereby incorporated by reference in its entirety.

FIELD

The present disclosure relates to a method for measuring a voltage in a high voltage range, to a fiber for carrying out the method, and to a method for manufacturing such a fiber.

As used herein, the term "high voltage" is used in the sense defined by the IEC (International Electrotechnical Commission) as any AC voltage exceeding 1 kV or any DC voltage exceeding 1.5 kV.

BACKGROUND INFORMATION

It has been known to measure voltages using optical means.

A known technique for measuring high voltages is described in EP 0 682 261. The technique described in EP 0 682 261 relies on the electro-optical effect, in which an electrical field changes the refractive index or birefringence of a light-transmitting element, namely a bulk single crystal. The crystal is a Pockels-type electro-optical material that changes its refractive index or birefringence linearly with the applied electric field. The method described in EP 0 682 261 allows the voltage to be measured over the crystal. For this purpose, two orthogonally polarized light beams are passed through the crystal twice, and the returned light beams are brought to interference, e.g. in a polarizer or an interferometer, for measuring their mutual phase shift.

Optical voltage sensors of this type for applications in air-insulated high-voltage substations commonly involve expensive dielectric insulation. The sensor of EP 0 682 261 makes use of the electro-optical effect in a bulk $Bi_4Ge_3O_{12}$ (BOO) crystal. The voltage of a power line (up to several 100 kV) is applied to the crystal having a length typically between 100 mm and 250 mm. This results in very high electric field strengths near the crystal. To avoid dielectric breakdown, the crystal is mounted in a high-voltage insulator tube filled with $SF_6$ gas under pressure.

The voltage sensor described in Ref. [2] as identified below uses several small electro-optical crystals which are mounted in a high-voltage insulator. The crystals measure the local electric fields. The sum of these local fields serves as an approximation of the line integral of the field. Here, the field strengths are lower and insulation with nitrogen at atmospheric pressure is sufficient. However, this technique involves such as extra measures permittivity-shielding to stabilize the electric field distribution and avoid excessive approximation errors. The present disclosure identifies particular references by numerical designation. The references are specifically identified herein following the detailed description of the exemplary embodiments.

SUMMARY

According to an exemplary embodiment, a method is provided for measuring a voltage in a high voltage range between a first point and a second point. The exemplary method comprises the steps of: arranging at least one electro-optical light transmitting element between the first point and the second point; passing light through the electro-optical light transmitting element from the first point to the second point; and measuring a phase shift introduced in the light by an electric field of the electro-optical light transmitting element. According to the exemplary method, the electro-optical light transmitting element forms a waveguiding fiber, the light is guided in the fiber between the first point and the second point, and the fiber has a crystalline core surrounded by a cladding.

According to an exemplary embodiment, a method is provided for measuring a voltage in a high voltage range between a first point and a second point. The exemplary method comprises the steps of: arranging at least one electro-optical light transmitting element between the first point and the second point; passing light through the electro-optical light transmitting element from the first point to the second point; and measuring a phase shift introduced in the light by an electric field of the electro-optical light transmitting element. The electro-optical light transmitting element forms a waveguiding fiber, and the light is guided in the fiber between the first point and the second point. In addition, the exemplary method comprises sending at least two polarizations of light on a roundtrip through the fiber; using a modulator for generating a periodic phase shift between the light in the at least two polarizations at an angular frequency $\omega_m$; and measuring at least two signals derived from an interference of light from the at least two polarizations, such that a first signal is measured at the frequency $\omega_m$ and a second signal is measured at the angular frequency $2\omega_m$.

BRIEF DESCRIPTION OF THE DRAWINGS

Further embodiments, advantages and refinements of the present disclosure are explained in more detail below with reference to exemplary embodiments which are illustrated in the drawings, in which like reference symbols are used to denote like elements, and in which.

DETAILED DESCRIPTION

Figure 1:
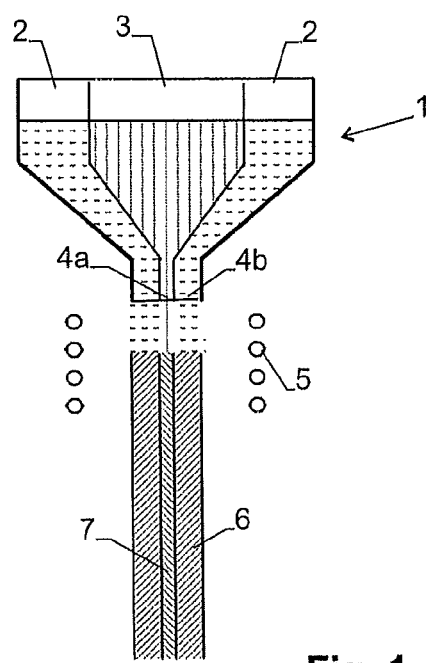
FIG. 1 shows an exemplary crucible and crystallizing apparatus for forming a crystalline fiber.

An exemplary embodiment of the present disclosure provides a method that improves the accuracy of measuring a voltage in a high voltage range.

According to an exemplary embodiment, the light-transmitting element can be a waveguiding fiber. The light can be guided along the fiber between the points over which the voltage is to be measured.

According to an exemplary embodiment, the fiber can integrate the electric field along a continuous path, such as over the full distance between ground and a high-voltage power line, for example. As a result there is no particular enhancement in the field strength. The fiber can be packaged in a thin, inexpensive insulator tube or mounted inside other high voltage components such as a circuit breaker. Since the fiber measures the exact line integral of the field, variations in the field distribution, e.g. due to rain or surface pollution, do not cause any errors.

Exemplary embodiments of the present disclosure also relate to a fiber for carrying out the aforementioned method. Such a fiber can be a waveguiding fiber and can comprise an electro-optical material. According to an exemplary embodiment, the fiber can have a non-centric crystalline or molecular structure along its axis so as to exhibit a Pockels-type electro-optical effect under an axially applied electrical field.

Exemplary embodiments of the present disclosure are also related to a method for manufacturing such a fiber, in which a material is molten, extruded through a nozzle and crystallized to a crystalline structure having a non-centric crystalline axis. This allows a fiber showing the Pockels type electro-optical effect to be manufactured.

Exemplary embodiments of the present disclosure can be used advantageously for measuring high voltages as discussed above, and are particularly advantageous for measuring voltages exceeding 50 kV, for example. Exemplary embodiments of the present disclosure and advantageous effects thereof are described in greater detail below with reference to the drawings.

1. Exemplary Material Classes

According to an exemplary embodiment, for a line integration of the electric field, the sensor advantageously measures only the electric field component parallel to the integration path, i.e., only the electric field components parallel to the propagation path of the light should give rise to a measurable change of refractive index or birefringence. Field components perpendicular to the path should not contribute to the signal. Several electro-optical crystal classes can meet this requirement. Such electro-optical crystal classes can have a non-centric crystalline or molecular structure along the fiber axis, i.e., along the direction of propagation of the light. They can include materials free of intrinsic birefringence and materials with intrinsic birefringence. The corresponding crystal classes, the alignment of the crystal axes in a voltage sensor, the directions of the electro-optical axes as well as some examples for materials are listed in Ref. 1 as identified below. An exemplary material is $Bi_4Ge_3O_{12}$ (BOO).

According to an exemplary embodiment, another fiber material can be a polymer having electro-optical, polar chromophores embedded therein, with the chromophores being aligned along the fiber axis (e.g., by applying an axial electrical field during the manufacturing process while the material is above its glass temperature for generating the required non-centric molecular structure).

2. The Fiber

According to an exemplary embodiment, the fiber advantageously supports only a single spatial mode, which may have two orthogonal directions of polarization, in which the birefringence between the orthogonal polarizations changes as a function of the axially applied electrical field. However, the fiber can also support more than one spatial mode, if appropriate.

According to an exemplary embodiment, the refractive index of the fiber should advantageously be changed by the electrical field through the Pockels effect. Since, according to the Pockels effect, the refractive index change depends substantially linearly on the applied electrical field, such materials allow accurate measurements over a wide field range. Furthermore, the Pockels effect is directionally selected since it only occurs for fields applied along non-centric crystal directions, which permits adaptation of the fiber to ignore electric field components perpendicular to the path.

According to an exemplary embodiment, the fiber is advantageously placed in a controlled fluid environment, e.g., with the fluid being an oil. On the one hand, this can prevent the surface of the fiber from being contaminated, e.g., by dirt, thereby increasing its waveguiding properties and channel separation between the modes. Also, a fluid with a high refractive index close to the refractive index of the fiber reduces the number of modes that can be guided within the fiber.

The fiber can also, for the same reason, be provided with a waveguiding core surrounded by a cladding. Advantageously, the core can be crystalline of a crystal exhibiting the Pockels-type electro-optical effect, while the cladding can either be crystalline or non-crystalline. The core and the cladding can advantageously be of the same carrier material but differ in dopants and/or structure, which reduces strain and increases cohesion. The cladding may also be a polymer.

Methods for manufacturing such fibers are described in the following.

3. Crystalline Fiber Manufacturing

Electro-optical materials like BGO can be grown in the form of a light guiding fiber. A common growth method is the micro-pulling down technique [see Refs. 3, 4 identified below for details]. The raw materials can be heated and made molten in a platinum crucible. The crucible has a micro nozzle at its bottom. A single crystal fiber can be grown by bringing a small seed crystal to the nozzle and pulling seed crystal downward at an approximately constant speed. The orientation of the seed crystal determines the orientation of the crystal axes in the fiber. Fibers can be grown with lengths of at least 1 m to 2 m, for example. Integration paths longer than the length of an individual fiber piece can be realized by arranging several fibers in series. Such fibers have been of interest mainly as scintillating detectors for x-rays and gamma rays, e.g., in nuclear medicine, high energy physics or gamma ray spectroscopy.

Rod-Type Crystal Fiber

In the simplest case, the fiber can be a rod-type structure with a diameter in the range between, for example, 0.1 m to 4 mm, i.e. there is no fiber cladding and the fiber is highly multi-mode. The fiber can be operated as a (multi-mode) waveguide. The refractive index step between the fiber and the environmental medium creates the waveguide properties.

For voltage sensing, the fiber can be placed in a controlled fluid environment, such as a gas atmosphere (e.g. nitrogen or $SF_6$ gas) or an oil-filled capillary including a fused silica, for example. The refractive index of the oil should be below and ideally close to the index of the fiber material, because a small index difference reduces the number of guided modes. The refractive index of, for example, BGO at 800 nm is 2.07 [see Ref. 5 identified below].

Crystal Fiber with Polymer Cladding

According to an exemplary embodiment, an alternative is to apply a polymer cladding to the fiber, as it is known from so-called silica/hard polymer clad optical fibers. Here, the refractive index of the polymer can be in the range between 1.4 and 1.5, for example. A crystalline fiber requires a polymer with an enhanced refractive index, however. Polymers with high refractive indices are of particular interest for optoelectronics applications and have been developed for such purposes. By adding metal oxides such as titanium oxide or zirconium oxide, refractive indices in the visible as high as 1.9 were achieved [see Refs. 6, 7 identified below]. Prototype materials with even a higher refractive index have been reported. Another method to increase the refractive index of polymers including acrylates, epoxies and silicones is the addition of nano-particles of compound semiconductors such as ZnS particles [see Ref. 8 identified below].

A voltage sensor can be commonly operated in the near infrared. Therefore, semiconductor particles with relatively small bandgaps (such as bandgaps near the red end of the visible spectrum, e.g. CdSe, CdTe) are of particular interest.

Fiber with Crystalline Core and Crystalline Cladding

An exemplary embodiment advantageously provides a fiber with a crystalline core and a crystalline cladding. A refractive index difference between the core and the cladding may be generated by adding appropriate dopants to the core and/or cladding. For example, it is known that the addition of $Eu^{3+}$-dopants to BGO creates extra absorption bands [see Ref. 4] and thus a change in the refractive index spectrum. Many other dopants for BGO have been reported (rare earth and metal ions including Ce, Nd, Sm, Tb, Ho, Er, Cr, Mn, Fe, Ni, Cu, W, Pb) [Ref. 9]).

According to an exemplary embodiment as illustrated in FIG. 1, a fiber with a core and a cladding may be grown by using a crucible 1 with two concentric compartments 2, 3 containing the raw materials with different concentrations and/or different types of dopants, respectively. Instead of a single nozzle, there can be two concentric micro-nozzles 4a, 4b at the bottom of two concentric crucible compartments 2, 3. The two materials from the concentric compartments 2, 3 can be co-extruded (or co-pulled) and crystallized under the control of a heater 5, such that the material from the outer compartment 2 can form the cladding 6 while the material from the inner compartment 3 can form the core 7.

Crystal Fiber with a Waveguide Through Ion Implantation

A further alternative to creating a waveguide in an electro-optical fiber—or in bulk material—is by means of ion implantation. It has been reported that a waveguide in bulk BGO can be generated by implantation of $He^+$ ions [see Refs. 10, 11]. The ion implantation produced an index increase of about 1%-2%. With this method, the fiber may serve as a "substrate" and a waveguiding core can be created therein by irradiation with suitable ions.

Crystal Fiber with a Laser-Written Waveguide

Still another alternative to creating a waveguide is irradiation with laser light, such as short laser pulses, for example. It is well-known that single-mode waveguides can be created in fused silica and other glasses by exposing the intended waveguide region with pico- or femtosecond laser pulses [see Ref. 12]. Light-induced refractive index changes can be created in electro-optical materials as well, particularly when appropriately doped. Persistent refractive index changes in undoped and chromium doped BGO were reported [see Ref. 13]. Hence, exposing the inner part of the material of the fiber to sufficiently strong laser pulses allows a waveguiding fiber core to be formed.

4. Polarimetric Detection

Figure 2:
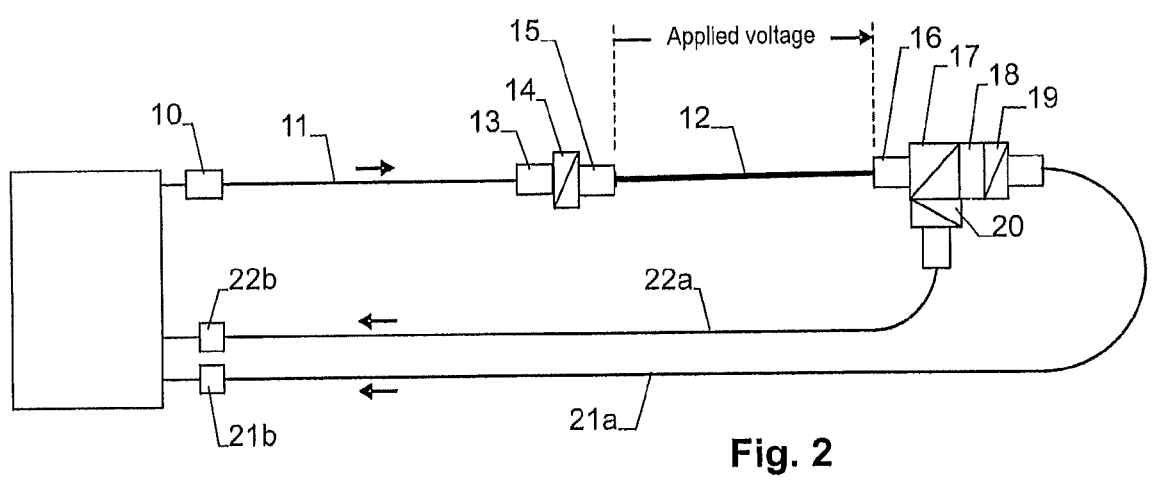
FIG. 2 shows an exemplary first measurement technique using such a fiber.

FIG. 2 shows an exemplary configuration of a polarimetric detection scheme using an electro-optical sensing fiber as described above. Advantageously, a light source 10 of low coherence can be used (for example, a light emitting diode or a superluminescent diode (SLD)). In case of an SLD, the light can be depolarized in a fiber depolarizer. An optical feed fiber 11 can bring the light from the source 10 to the electro-optical sensing fiber 12. Depending on the type of light source 10 and the diameter of the electro-optical fiber 12, the feed fiber 11 can be a multi-mode fiber, a single-mode fiber or a polarization maintaining single-mode fiber.

After collimation in a collimator 13, the light can be polarized in polarizer 14 and coupled via a collimator 15 into the sensing fiber 12. The polarizer 14 can be aligned at approximately or precisely 45°, for example, to the electro-optical axes of the crystalline sensing fiber 12. The transmitted light exiting from the sensing fiber 12 can again be collimated in a collimator 16 and then split in two channels by means of a beam splitter 17. In case of relatively thick sensing fibers, the collimators 15 and 16 can be omitted (such as when a collimated beam is in a fiber). One of the two exit channels can contain both a quarter-wave plate ($\lambda/4$) 18 and a polarizer 19, while the other exit channel can contain only a polarizer 20. The wave plate axes of the quarter-wave plate 18 can be aligned parallel to the electro-optical axes of the sensing fiber 12. The polarizers 19, 20 can be aligned at approximately or precisely 45°, for example, to the electro-optical axes of the sensing fiber 12. Two multimode fibers 21a, 22a can bring the light back to two photo detectors 21b, 22b.

The quadrature signals in the two channels measured by the photodiodes 23, 24 are given by (see also Ref. 1):

Channel 1 (with wave-plate 18):

$$I_1 = (1/2)I_0[1 + \cos(\Gamma - \pi/2)] \quad (1)$$

$$I_1 = (1/2)I_0[1 - \sin\Gamma] \quad (2)$$

Channel 2:

$$I_2 = (1/2)I_0[1 + \cos\Gamma] \quad (3)$$

$I_0$ is proportional to the light intensity. For simplicity, it is assumed that the fringe visibility is equal to unity. $\Gamma$ is the electro-optical phase retardation (Pockels effect) and varies with the applied voltage V according to:

$$\Gamma = \pi(V/V_\pi) \quad (4)$$

Here $V_\pi$ is the so-called half wave voltage:

$$V_\pi = \lambda/(2r\,n^3), \quad (5)$$

where $\lambda$ is the wavelength, r is the relevant electro-optical coefficient for the longitudinal Pockels effect (e.g., $r_{63}(=r_{41})$ in BGO), and n is the refractive index of the electro-optical fiber. The half wave-voltage of BGO at 800 nm is about 41 kV [see Ref. 5]. Since the applied voltage is typically up to several hundred kilovolts, the signals $I_1$ and $I_2$ can go through several periods between two extreme values of the applied voltage. However, the two quadrature signals $I_1$, $I_2$ can be processed in such a way that the waveform of the applied voltage is reconstructed [see Ref. 14].

Figure 3:
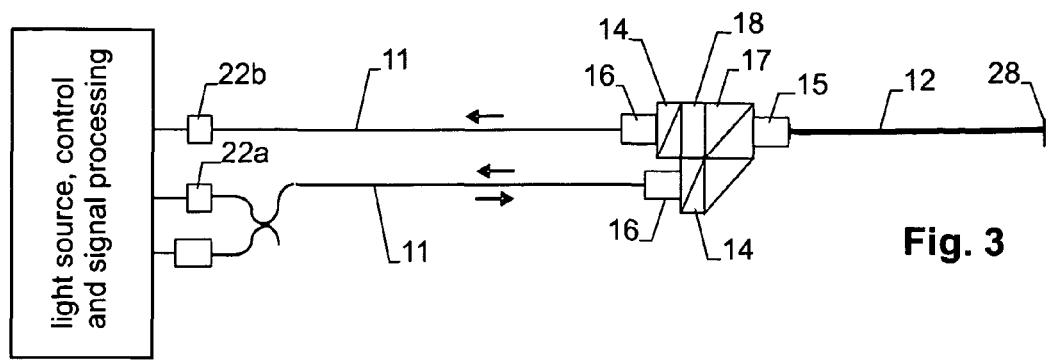
FIG. 3 shows an exemplary second measurement technique using such a fiber.

FIG. 3 shows an exemplary configuration in which the fiber is operated in reflection using a mirror 28 at the end of the sensing fiber 12. This arrangement of the optical components is equivalent to the one in FIG. 1b of Ref. 1. Compared to FIG. 1, the sensitivity can be doubled (the halve-wave voltage can be lowered by a factor of 2).

4.4 Interferometric Detection

Figure 4:
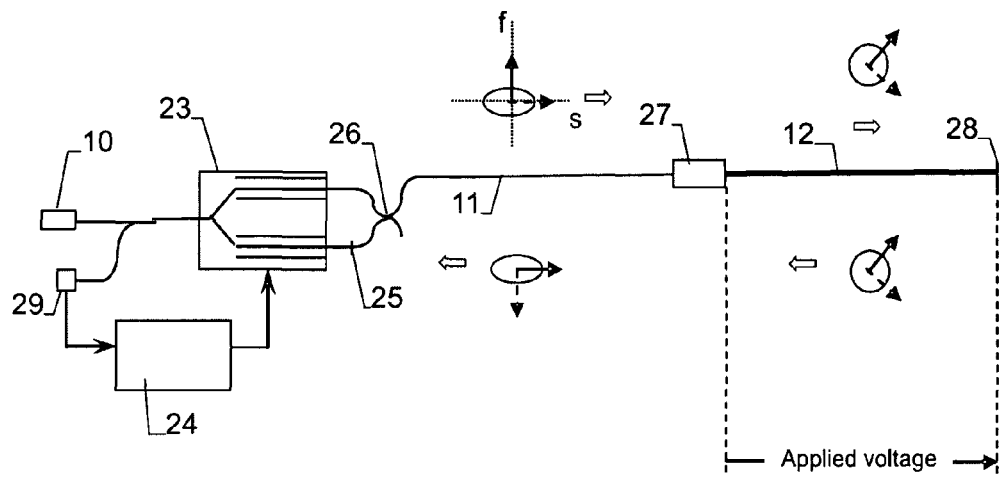
FIG. 4 shows an exemplary third measurement technique using such a fiber.

FIG. 4 shows an exemplary configuration employing a detection technique adapted from fiber-optic gyroscopes [see Ref. 15] and interferometric current sensors [see Ref. 16]. The detection of the large electro-optical phase shifts $\Gamma$ (up to several multiples of $\pi$) can involve some adaptation of the signal processing not described in Ref 15. and Ref. 16, however.

The exemplary configuration of FIG. 4 comprises a polarizing beam splitter and phase modulator 23 that has two parallel polarized outputs, the relative phase of which can be changed by means of an applied electric voltage from a signal processor 24. One output can be led directly, and the other via a 90° splice 25, to a polarization-maintaining fiber coupler 26. From there, the two orthogonally polarized waves can be transmitted over a polarization maintaining feed fiber 11, to a 45° Faraday rotator 27, i.e. a non-reciprocal polarization rotator, from where they can be coupled into sensing fiber 12. A mirror 28 at the end of sensing fiber 12 can project the waves back through sensing fiber 12, Faraday rotator 27 (where the beams are rotated by another 45°), feed fiber 11 and fiber coupler 26. The light waves can pass through phase modulator 23 and be fed to a photo detector 29.

The non-reciprocal optical phase modulator 23 can produce a periodic phase shift $\phi_m = \hat{\phi}_m \sin \omega_m t$ with an amplitude $\hat{\phi}_m$ and an angular frequency $\omega_m = 2\pi v_m t$. The modulation frequency $v_m$ can, for example, be chosen as $v_m = 1/(2T)$ (or, equivalently, $\omega_m = \pi/T$), where T is the roundtrip time of the light in the optical circuit, i.e. the time it takes the light exiting from modulator 23 to return thereto. The modulation amplitude $\hat{\phi}_m$ (for a given modulator drive voltage) is then at a maximum.

The detected signal is given by $$I = I_O(1 + \cos \Delta\phi) \quad (6)$$

with $\Delta\phi = \phi_m + r$ (7)

Using Bessel functions, the signal I can then be expressed as $$I'/I_o = 1 + \left[ J_o(\Phi_m) + 2\sum_{k=1}^{\infty} J_{2k}(\Phi_m)\cos 2k\omega_m t \right]\cos\phi_s + \left[ 2\sum_{k=1}^{\infty} J_{2k-1}(\Phi_m)\cos(2k-1)\omega_m t \right]\sin\phi_s \quad (8)$$

with $\phi_S = \Gamma$.

If only the DC term and the first and second harmonics (frequencies $\omega_m$, $2\omega_m$) are considered, the signal can be written as $$I = I_O[1 + J_0(\Phi_m) + 2J_2(\omega_m)\cos(2\omega_m t)\cos\Gamma + \ldots + 2J_1(\Phi_m)\cos(\omega_m t)\sin\Gamma + \ldots \quad (9)$$

For a given value of the modulation amplitude $\hat{\phi}_m$, the amplitudes of the first and second harmonics can vary in proportion to $\sin \Gamma$ and $\cos \Gamma$, respectively, i.e., there are again two quadrature signals. The waveform of the applied voltage can be reconstructed from these two signals in the same way as it is done in the polarimetric scheme. According to an exemplary embodiment, $\hat{\phi}_m$ is chosen such that the two harmonics have the same amplitude, i.e. $J_1(<\hat{\phi}_m)=J_2(\hat{\phi}_m)$. This is the case for $\hat{\phi}_m = 2.58$ rad. Another exemplary value of $\hat{\phi}_m$ is 1.84 rad, where $J_1(\hat{\phi}_m)$ is at its maximum. Alternatively, $\hat{\phi}_m$ can be chosen arbitrarily and the harmonics amplitudes can be properly normalized by the signal processor.

Figure 5:
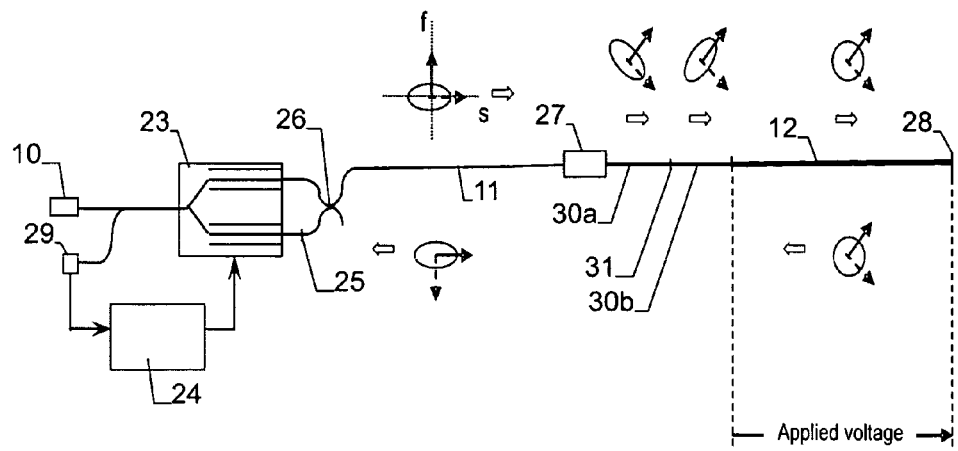
FIG. 5 shows an exemplary fourth measurement technique using such a fiber.

The exemplary configuration in FIG. 5 is the same as in FIG. 4, except the electro-optical sensing fiber 12 is separated from the Faraday rotator 27 by two sections of polarization-maintaining (pm) fiber 30a, 30b. The separation can be advantageous in the practical implementation of the sensor. The axes of the two pm fiber sections can be at 45°, for example, with respect to axes of the pm feed fiber 11 before the rotator. There can be two pm sections with a 90°-splice 31 in between so as to keep total optical path imbalance at zero (see EP 1 154 278).

Figure 6:
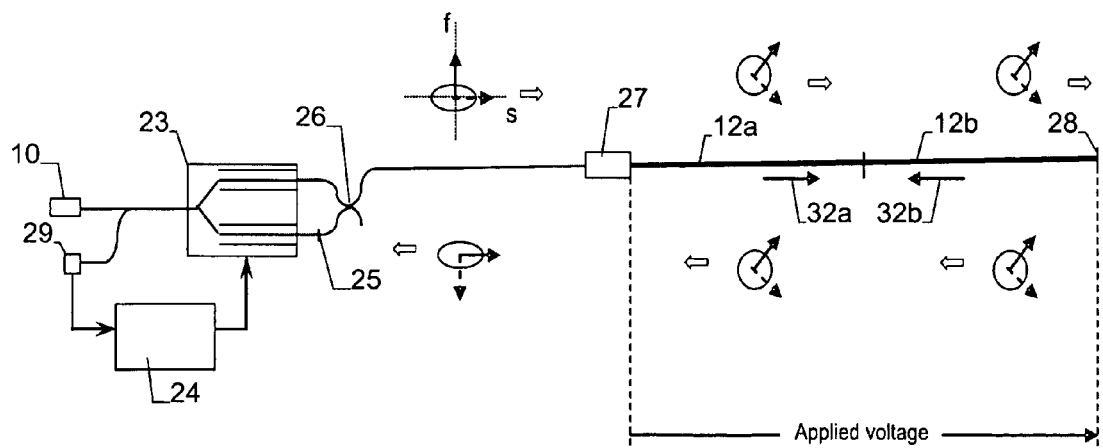
FIG. 6 shows a fifth measurement technique using such a fiber.

FIG. 6 shows an exemplary configuration with two sections of electro-optical sensing fiber 12a, 12b. The electro-optical axes of the two sections 12a, 12b can have a 90° angular offset and the directions 32a, 32b of the polar crystal axes in the fiber 12a, 12b can be anti-parallel. This exemplary configuration is advantageous if fibers with intrinsic birefringence are used (crystal classes 6 m2 and 2 mm) as the intrinsic (i.e. field-independent) birefringent phase retardations in the two sections to cancel each other. In contrast, the electro-optical phase shifts add to each other.

According to another exemplary embodiment, the electro-optical fibers(s) could be part of a loop mirror configuration or a Sagnac configuration.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCES

1. EP 0682261.
2. P. P. Chavez et al., IEEE Transactions on Power delivery 17, 362, 2002.
3. D. H. Yoon et al., J. Crystal Growth 142, 339, 1994.
4. J. B. Shim et al, J. Applied Physics 93, 5131, 2003.
5. P. A. Williams et al., Applied Optics 35, 3562, 1996.
6. Y. Wang et al., in Proceedings of SPIE, vol. 5724, 42, 2005.
7. T. Flaim et al., SPIE Proceedings on Optical Systems Design, Advances in Optical Thin Films, Vol. 5250, 423, 2003.
8. C. Lü et al., J. Matr. Chem., 13, 2189, 2003.
9. S. G. Raymond et al., Radiation Measurements 23, 195, 1994.
10. S. M. Mahdavi et al, J. of Physics D: Applied Physics 22, 1354, 1989.
11. S. M. Mahdavi et al, Nuclear Instruments and Methods in Physics Research B65, 251, 1992.
12. K. Miura et al., Appl. Physics Letters 71, 3329, 1997.
13. J. S. McCullough et al., Journal of Applied Physics 90, 6022, 2001.
14. U.S. Pat. No. 4,904,931, Feb. 27, 1990.
15. "The fiber-optic gyroscope", Herve Lefevre, Artech House, Boston, London, 1993.
16. EP 1 154 278.

LIST OF REFERENCE NUMERALS

1: crucible
2, 3: crucible compartments
4a, 4b: nozzles
5: heater
6: cladding
7: core
10: light source
11: feed fiber
12, 12a, 12b: sensing fiber
13: collimator
14: polarizer
15: collimator
16: collimator
17: beam splitter
18: quarter-wave plate
19: polarizer
20: polarizer
21a, 22a: multimode fibers
21b, 22b: photo detectors
23: beam splitter and phase modulator 24: signal processor
25: 90° splice
26: fiber coupler
27: Faraday rotator
28: mirror
29: photo detector
30a, 30b: polarization maintaining fiber
31: 90° splice
32a, 32b: directions of the polar crystal axes.

What is claimed is:

1. A method for measuring a voltage in a high voltage range, between a first point and a second point, the method comprising the steps of:
    arranging at least one electro-optical light transmitting element between said first point and said second point;
    passing light through said electro-optical light transmitting element from said first point to said second point; and
    measuring a phase shift introduced in said light by an electric field of said electro-optical light transmitting element;
    using polarimetric detection in transmission of said light, in which one of two exit channels contains a quarter-wave plate and a polarizer, and the other one of the two exit channels contains only a polarizer; and
    measuring quadrature signals in the two channels,
    wherein said electro-optical light transmitting element forms a waveguiding fiber and said light is guided in said fiber between said first point and said second point, and
    wherein said fiber has a crystalline core surrounded by a cladding.

2. The method of claim 1, wherein said cladding is crystalline.

3. The method of claim 2, comprising the step of:
    adding appropriate dopants to at least one of the core and the cladding, including $Eu^{3+}$-dopants or rare earth and metal ions selected from the group consisting of Ce, Nd, Sm, Tb, Ho, Er, Cr, Mn, Fe, Ni, Cu, W, Pb.

4. The method of claim 2, wherein said cladding and said core are constituted by the same carrier material, and
    said cladding and said core differ with respect to each other in at least one of respective dopants and structure.

5. The method of claim 1, wherein said cladding is a polymer.

6. The method of claim 5, wherein said cladding comprises polymers with refractive indices in the visible range as high as 1.9.

7. The method of claim 5, wherein said polymer cladding comprises one of metal oxides and nano particles of compound semiconductors.

8. The method of claim 7, wherein the metal oxide includes at least one of titanium oxide and zirconium oxide, and the nano particles of compound semiconductors include ZnS particles.

9. The method of claim 5, wherein said polymer cladding comprises semiconductor particles with small bandgaps near the red end of the visible light spectrum.

10. The method of claim 1, wherein said core comprises $Bi_4Ge_3O_{12}$.

11. The method of claim 1, wherein:
    the light source is at least one of a light emitting diode and a superluminescent diode; and
    the optical fiber is one of a multi-mode fiber, a single-mode fiber, and a polarization maintaining single-mode fiber.

12. The method of claim 1, wherein said fiber has an non-centric crystalline or molecular structure, along a direction of propagation of said light.

13. The method of claim 1, wherein said fiber has an non-centric crystalline or molecular structure, along a direction of propagation of said light.

14. The method of claim 1, wherein only electric field components along a direction of propagation of said light provide a change of refractive index or birefringence in said fiber.

15. A method for measuring a voltage in a high voltage range, between a first point and a second point, the method comprising the steps of:
    arranging at least one electro-optical light transmitting element between said first point and said second point;
    passing light through said electro-optical light transmitting element from said first point to said second point; and
    measuring a phase shift introduced in said light by an electric field of said electro-optical light transmitting element;
    using polarimetric detection; and
    operating the fiber in reflection using a mirror at the end of said fiber,
    wherein said electro-optical light transmitting element forms a waveguiding fiber and said light is guided in said fiber between said first point and said second point, and
    wherein said fiber has a crystalline core surrounded by a cladding.

16. A method for measuring a voltage in a high voltage range between a first point and a second point, the method comprising the steps of:
    arranging at least one electro-optical light transmitting element between said first point and said second point;
    passing light through said electro-optical light transmitting element from said first point to said second point;
    measuring a phase shift introduced in said light by an electric field of said electro-optical light transmitting element, said electro-optical light transmitting element forming a waveguiding fiber, and said light being guided in said fiber between said first point and said second point,
    sending at least two polarizations of light on a roundtrip through said fiber;
    using a modulator for generating a periodic phase shift between the light in said at least two polarizations at an angular frequency $\omega_m$; and
    measuring at least two signals derived from an interference of light from said at least two polarizations, wherein a first signal is measured at the frequency $\omega_m$ and a second signal is measured at the angular frequency $2\omega_m$.

17. The method of claim 16, wherein said angular frequency $\omega_m$ equals $\pi/T$, wherein T is a roundtrip time for light exiting from said modulator and returning to said modulator.

18. The method of claim 17, comprising the steps of:
    determining a given value of the modulation amplitude; and
    using the amplitudes of first and second harmonics of the light as quadrature signals which vary in proportion to $\sin(\Gamma)$ and $\cos(\Gamma)$, in which $\Gamma$ is the electro-optical phase retardation.

19. The method of claim 17, comprising the steps of:
    using a polarizing beam splitter and phase modulator having two parallel polarized outputs, for which the relative phase is adaptable by a signal processor;
    leading one output of the beam splitter directly, and leading the other output of the beam splitter via a 90° splice, to a polarization maintaining fiber coupler, transmitting the two orthogonally polarized waves over a polarization maintaining feed fiber to a 45' Faraday rotator, and coupling the rotated signals into the fiber;

propagating the light waves, via a mirror at a terminal end of the fiber, back through the sensing fiber, the Faraday rotator, the polarization maintaining feed fiber and the polarization maintaining fiber coupler; and passing the light waves through the phase modulator and feeding the phase-modulated waves to a photo detector.

20. The method of claim 16, comprising the steps of:
determining a given value of the modulation amplitude; and
using the amplitudes of first and second harmonics of the light as quadrature signals which vary in proportion to $\sin(\Gamma)$ and $\cos(\Gamma)$, in which $\Gamma$ is the electro-optical phase retardation.

21. The method of claim 20, comprising the step of:
setting the value of the modulation amplitude to be equal to 2.58 rad such that the two harmonics have the same amplitude.

22. The method of claim 20, comprising the step of:
setting the value of the modulation amplitude equal to 1.84 rad so that the first harmonics is at its maximum.

23. The method of claim 20, comprising the step of:
arbitrarily setting the value of the modulation amplitude, and normalizing the harmonics amplitudes by a signal processor.

24. The method of claim 20, comprising the steps of:
using a polarizing beam splitter and phase modulator having two parallel polarized outputs, for which the relative phase is adaptable by a signal processor;
leading one output of the beam splitter directly, and leading the other output of the beam splitter via a 90° splice, to a polarization maintaining fiber coupler, transmitting the two orthogonally polarized waves over a polarization maintaining feed fiber to a 45'Faraday rotator, and coupling the rotated signals into the fiber;
propagating the light waves, via a mirror at a terminal end of the fiber, back through the sensing fiber, the Faraday rotator, the polarization maintaining feed fiber and the polarization maintaining fiber coupler; and
passing the light waves through the phase modulator and feeding the phase-modulated waves to a photo detector.

25. The method of claim 16, comprising the steps of:
using a polarizing beam splitter and phase modulator having two parallel polarized outputs, for which the relative phase is adaptable by a signal processor;
leading one output of the beam splitter directly, and leading the other output of the beam splitter via a 90° splice, to a polarization maintaining fiber coupler, transmitting the two orthogonally polarized waves over a polarization maintaining feed fiber to a 45'Faraday rotator, and coupling the rotated signals into the fiber;
propagating the light waves, via a mirror at a terminal end of the fiber, back through the sensing fiber, the Faraday rotator, the polarization maintaining feed fiber and the polarization maintaining fiber coupler; and
passing the light waves through the phase modulator and feeding the phase-modulated waves to a photo detector.

26. The method of claim 25, wherein the electro-optical sensing fiber is separated from the Faraday rotator by two sections of polarization-maintaining fiber, the axes of the two fiber sections being set at 45° with respect to the axes of the polarization maintaining feed fiber before the Faraday rotator, and further with a 90° splice present in between the two sections in order to keep total optical path imbalance at zero.

27. The method of claim 26, wherein two sections of electro-optical sensing fiber are used, the electro-optical axes of the two sections have a 90° angular offset, and directions of polar crystal axes in the two sections are anti-parallel.

28. The method of claim 25, wherein two sections of electro-optical sensing fiber are used, the electro-optical axes of the two sections have a 90° angular offset, and directions of polar crystal axes in the two sections are anti-parallel.

29. A method for manufacturing the fiber of claim 16, comprising the steps of:
melting a first material;
extruding said first material through a nozzle; and
crystallizing the extruded first material to a crystalline structure having a non-centric crystalline axis to produce said fiber having a crystalline core and a cladding surrounding said crystalline core.

30. The method of claim 29 comprising the steps of melting a second material,
co-extruding said first and said second material, and
crystallizing said first and said second material such that said second material forms a cladding around said first material.

31. The method of claim 30, comprising the steps of:
growing the fiber with a core and a cladding with a crucible having two concentric compartments containing raw materials of said fiber with at least one of different concentrations and different types of dopants comprised in said two concentric compartments, respectively, wherein the two concentric crucible compartments have two concentric micro-nozzles at downstream edges thereof opposite to an opening of the two concentric crucible compartments in which the raw materials are loadable;
co-extruding the materials loaded into the two concentric compartments; and
crystallizing the co-extruded materials under control of a heater, such that that material from an outer compartment among the two concentric compartments forms the cladding while the material from an inner compartment among the two concentric compartments forms the core of said fiber.

32. The method of claim 29, comprising the step of ion implanting $He^+$ ions to said crystallized first material for forming a waveguiding core.

33. The method of claim 29, comprising the step of exposing an inner part of said first material to laser light for forming a waveguiding fiber core.

34. The method of claim 33, comprising the steps of:
doping the electro-optical material; and
exposing the inner part of the material of the fiber to short laser pulses, including at least one of pico-laser pulses and femtosecond laser pulses.

35. The method of claim 29, wherein said cladding is crystalline.

36. The method of claim 35, comprising the step of:
adding appropriate dopants to at least one of the core and the cladding, including $Eu^{3+}$-dopants or rare earth and metal ions selected from the group consisting of Ce, Nd, Sm, Tb, Ho, Er, Cr, Mn, Fe, Ni, Cu, W, Pb.

37. The method of claim 35, wherein said cladding and said core are constituted by the same carrier material, and
said cladding and said core differ with respect to each other in at least one of respective dopants and structure.

38. The method of claim 29, wherein said cladding is a polymer.

39. The method of claim 38, wherein said cladding comprises polymers with refractive indices in the visible range as high as 1.9.

40. The method of claim 38, wherein said polymer cladding comprises one of metal oxides and nano particles of compound semiconductors.

41. The method of claim 38, wherein said polymer cladding comprises semiconductor particles with small bandgaps near the red end of the visible light spectrum.

42. The method of claim 29, wherein said core comprises $Bi_4Ge_3O_{12}$.

43. The method of claim 29, wherein:
the light source is at least one of a light emitting diode and a superluminescent diode; and
the optical fiber is one of a multi-mode fiber, a single-mode fiber, and a polarization maintaining single-mode fiber.

44. The method of claim 29, wherein the metal oxide includes at least one of titanium oxide and zirconium oxide, and the nano particles of compound semiconductors include ZnS particles.

45. The method of claim 29, wherein said fiber has an non-centric crystalline or molecular structure, along a direction of propagation of said light.

46. The method of claim 29, wherein said fiber has an non-centric crystalline or molecular structure, along a direction of propagation of said light.

47. The method of claim 29, wherein only electric field components along a direction of propagation of said light provide a change of refractive index or birefringence in said fiber.

48. The method of claim 16, wherein said core comprises $Bi_4Ge_3O_{12}$.

49. The method of claim 16, wherein said cladding is crystalline.

50. The method of claim 49, comprising the step of:
adding appropriate dopants to at least one of the core and the cladding, including $Eu^{3+}$-dopants or rare earth and metal ions selected from the group consisting of Ce, Nd, Sm, Tb, Ho, Er, Cr, Mn, Fe, Ni, Cu, W, Pb.

51. The method of claim 49, wherein said cladding and said core are constituted by the same carrier material, and said cladding and said core differ with respect to each other in at least one of respective dopants and structure.

52. The method of claim 16, wherein said cladding is a polymer.

53. The method of claim 52, wherein said cladding comprises polymers with refractive indices in the visible range as high as 1.9.

54. The method of claim 52, wherein said polymer cladding comprises one of metal oxides and nano particles of compound semiconductors.

55. The method of claim 54, wherein the metal oxide includes at least one of titanium oxide and zirconium oxide, and the nano particles of compound semiconductors include ZnS particles.

56. The method of claim 52, wherein said polymer cladding comprises semiconductor particles with small bandgaps near the red end of the visible light spectrum.

57. The method of claim 16, wherein said core comprises $Bi_4Ge_3O_{12}$.

58. The method of claim 16, wherein:
the light source is at least one of a light emitting diode and a superluminescent diode; and
the optical fiber is one of a multi-mode fiber, a single-mode fiber, and a polarization maintaining single-mode fiber.

59. The method of claim 16, wherein said fiber has an non-centric crystalline or molecular structure, along a direction of propagation of said light.

60. The method of claim 16, wherein said fiber has an non-centric crystalline or molecular structure, along a direction of propagation of said light.

61. The method of claim 16, wherein only electric field components along a direction of propagation of said light provide a change of refractive index or birefringence in said fiber.

* * * * *